Figure 1:
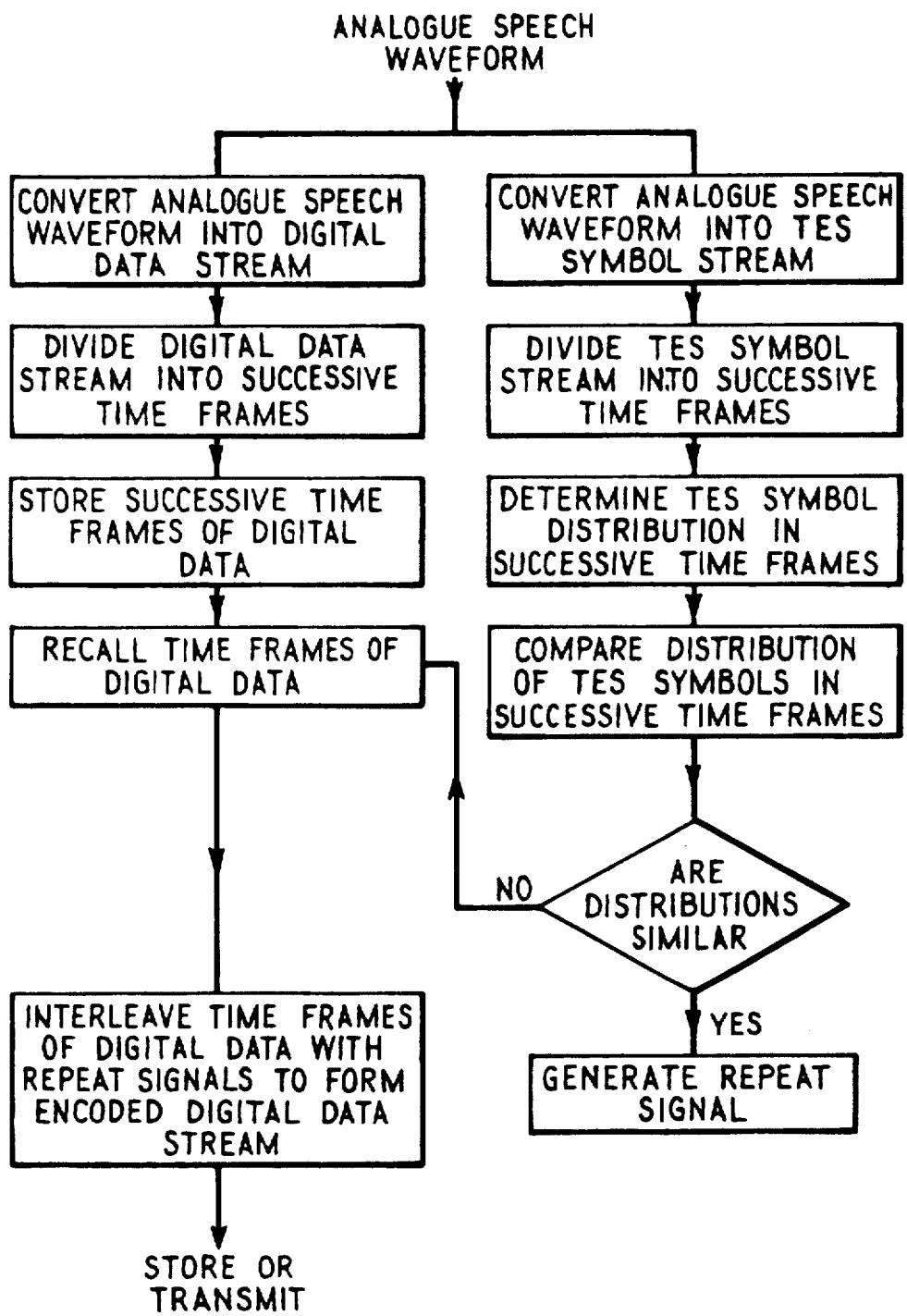

United States Patent [19]

King

[11] Patent Number: 5,101,433
[45] Date of Patent: Mar. 31, 1992

[54] ENCODING METHOD

[76] Inventor: Reginald A. King, 6 Clevedon Rd., Tilehurst, Reading, Berkshire, England

[21] Appl. No.: 667,260

[22] Filed: Mar. 11, 1991

Related U.S. Application Data

[63] Continuation of Ser. No. 566,869, Aug. 13, 1990, abandoned, which is a continuation of Ser. No. 433,392, Nov. 7, 1989, abandoned, which is a continuation of Ser. No. 220,362, Jul. 11, 1988, abandoned, which is a continuation of Ser. No. 749,026, Jun. 26, 1985, abandoned.

[30] Foreign Application Priority Data

Jun. 28, 1984 [GB] United Kingdom ............... 8416496

[51] Int. Cl.⁵ .............................................. G10L 5/00
[52] U.S. Cl. ......................................... 381/35; 381/36
[58] Field of Search ................................ 381/34-43

[56] References Cited

U.S. PATENT DOCUMENTS 3,382,160  5/1983  Gosling et al. ............... 381/31
3,499,996  3/1970  Klayman et al. ............. 381/32
3,609,244  9/1971  Mounts ........................ 381/32

FOREIGN PATENT DOCUMENTS

2020517 B  10/1982  United Kingdom

Primary Examiner—Emanuel S. Kemeny
Attorney, Agent, or Firm—Fleit, Jacobson, Cohn, Price, Holman & Stern

[57] ABSTRACT

An analog waveform such as speech is encoded by dividing the data stream into successive time frames consisting of Time Encoded Speech (TES) symbols. The distribution of the TES symbols in each frame is compared for successive frames whereby a small change causes a repeat code in place of a frame of corresponding digital signal data.

11 Claims, 2 Drawing Sheets

ENCODING METHOD

This application is a continuation of application Ser. No. 07/566,869, filed Aug. 13, 1990, which is a continuation of application Ser. No. 07/433,392, filed Nov. 7, 1989, which is a continuation of application Ser. No. 07/220,362, filed July 11, 1988, which is a continuation of application Ser. No. 06/749,026, filed June 26, 1985, now are all abandoned.

The present invention relates to an encoding method for an analogue waveform, and in particular, but not exclusively, to an encoding method for an analogue waveform representing speech.

Electrical waveforms derived from human speech are complex in character, having significant components extending from below 300 Hz, to above 3 kHz and a wide dynamic range. Such waveforms may be converted into streams of digital data by known methods such as Pulse Code Modulation (PCM), Delta Modulation or Time Encoding. In PCM, the analogue speech waveform is sampled and a digital code is assigned to each sample to indicate the instantaneous amplitude of the analogue waveform at the time the sample was taken. However, to obtain acceptable quality the sampling rate must be at least double the bandwidth of the waveform. Furthermore, the digital code indicating amplitude normally comprises at least an 8 bit code. Hence, assuming a bandwidth of 3 kHz for the speech waveform, it can be seen that the digital data stream will contain 48k bits/second. In most commercial applications 64k bits/second are generated as the bandwidth is taken as 4 kHz.

In Delta Modulation the analogue speech waveform is sampled, as with PCM. A single bit descriptor code is then assigned to each sample in order to describe the amplitude of the sample with respect to the preceding sample. However, as a single bit descriptor code is used it is necessary to use a higher sample rate than PCM and, for commercial applications, a sample rate of at least 32k bits/second is necessary. Hence, the digital data stream generated will contain 32k bits/second.

In Time Encoding, the locations of the real zeros in the analogue waveform are determined by quantising in the time domain. The shape of the waveform between successive zeros is then determined by studying the number of events, e.g. maxima or minima, in the waveform between successive real zeros. A series of coded symbols is generated by grouping the successive zeros with their associated events. These symbols are known as TES symbols, and the analogue speech waveform can be reconstructed from them.

Since the analogue speech waveform is of restricted bandwidth only a limited number of coded symbols are necessary. For example, in a speech waveform having a bandwidth of 300 Hz to 3.3 kHz with a sampling rate of 20k samples/second, only a limited variation in half cycle durations can occur. At the highest frequency, 3.3 kHz, the half cycle duration is approximately 3 quanta, at the lowest frequency, 300 Hz, the half cycle duration is approximately 34 quanta. By applying mapping logic it has been found that an alphabet of about 27 TES symbols can be used to define the analogue speech waveform. As there are fewer than 32 symbols, a 5 bit constant length (linear) binary word may be allocated to represent each TES symbol. Hence, the TES symbol stream is represented by a digital data stream of 5 bit constant length (linear) data words. In practice, however, additional data may be included, such as amplitude information so that each symbol would be represented by a (5+n) bit constant length (linear) data word, where n is normally a 1 to 3 bit code word. The principles of Time Encoded Speech (TES) are described in detail in UK Patent No. 2020517. By adopting Time Encoding it is possible to represent an analogue speech waveform by a digital data stream having a bit rate of approximately 12k bits/second, whilst maintaining acceptable quality.

It is often desirable to store digitally encoded speech but it can be seen that, with existing methods of encoding, large memories are required to store relatively short periods of speech because of the number of bits of digital information to be stored per second of the analogue speech waveform. In order to reduce memory requirements, a reduction in the bit rate of the digital data stream is both desirable and necessary.

It is an object of the present invention to provide a method of encoding data whereby the bit rate of the digital data stream representing the data is reduced substantially from that obtained with existing methods. The method of the present invention is, therefore, particularly applicable when it is required to store speech in digital form. Furthermore, in transmission by line or radio the lower bit rate means that a narrower bandwidth is required for transmission. If a narrower bandwidth is not adopted the time required to transmit a given quantity of data is reduced, which may be particularly advantageous when the data is to be transmitted by telephone line link.

According to the present invention there is provided an encoding method for an analogue waveform, the method comprising deriving a digital data stream from the analogue waveform, dividing the digital data stream into a number of successive time frames of equal time period, storing the digital data in respect of successive time frames, deriving a stream of time encoded symbols from the analogue waveform, dividing the stream of time encoded symbols into successive time frames corresponding to the successive time frames of the digital data stream, storing the time encoded symbols for successive time frames, determining and comparing the distribution of the time encoded symbols for successive time frames, and reconstructing a digital data stream from the digital data stored and derived digital data which is dependent upon the results of the comparison of the time encoded symbols for successive time frames.

Preferably the time frames are of 10 to 20 millisecond time period.

The digital data derived from that stored in respect of one or more time frames may comprise digital data stored in the immediately preceding time frame.

The reconstructed digital data stream may be stored.

The reconstructed digital data stream may be transmitted.

The digital data stream may be derived from the analogue waveform by pulse code modulation.

The digital data stream may be derived from the analogue waveform by delta modulation.

The digital data stream may be derived from the analogue waveform by time encoding.

Figure 2:
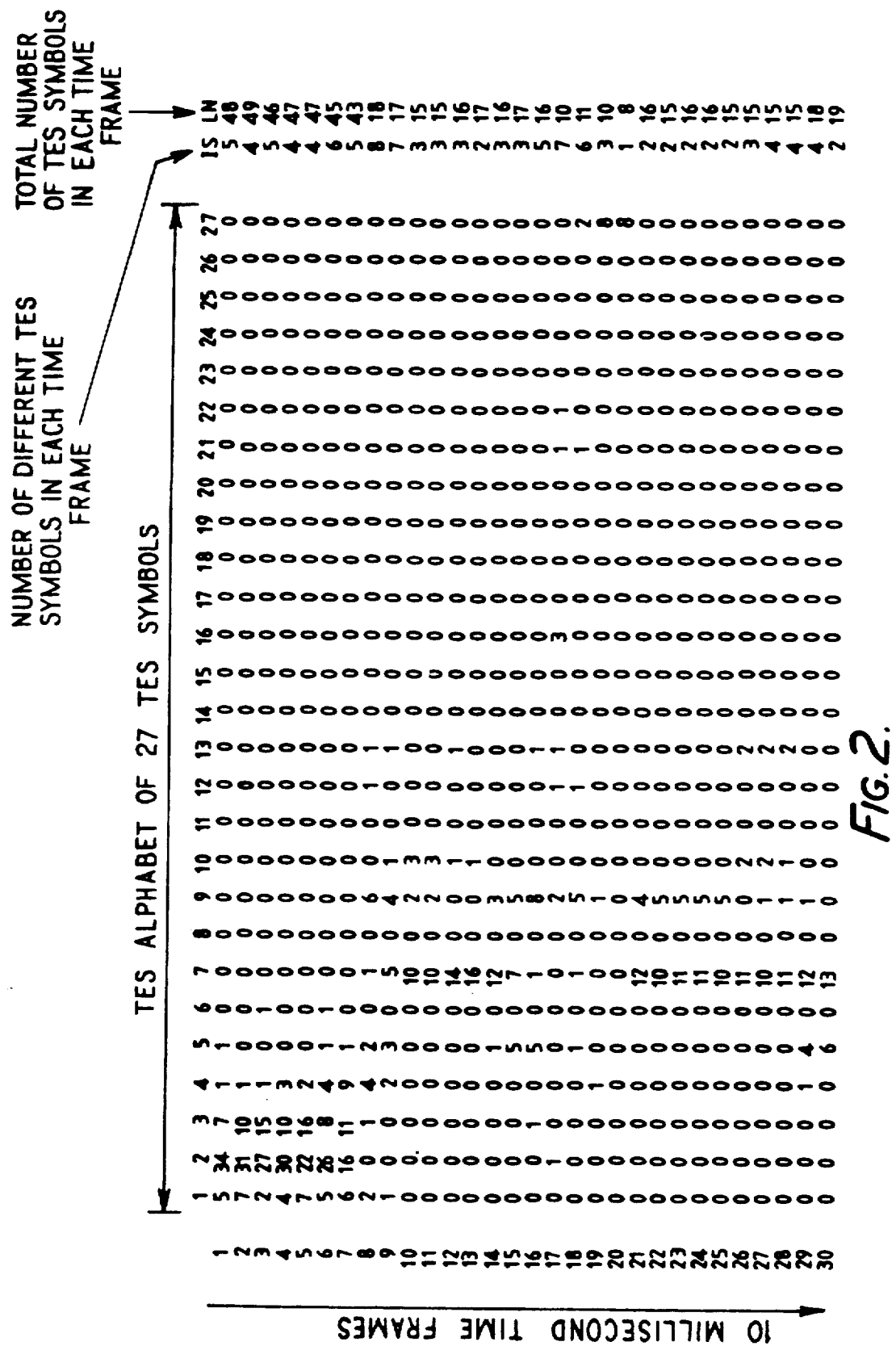

The digital data stream may be derived from the analogue waveform by any other method of digital encoding, The present invention will now be described, by way of example, with reference to the accompanying drawings in which:

FIG. 1 shows a flow chart illustrating an encoding method in accordance with the present invention, and FIG. 2 shows a table illustrating the distribution of time encoded symbols representing a short period of speech.

Referring to the drawings, an analogue waveform, for example an analogue speech waveform, is digitized into a digital data stream by any known method such as for example Pulse Code Modulation, Delta Modulation, or Time Encoding. The digital data stream is then divided into a number of successive time frames of equal time period and stored. In this example a 10 millisecond time period has been chosen but time periods of longer or shorter duration may also be adopted. Any store suitable for storing quantities of digital information may be used to store the time frames of digital data. The division of the digital data stream into the successive time frames may be achieved by gating at the required 10 millisecond time intervals.

The analogue speech waveform is also time encoded into a stream of TES symbols. Apparatus suitable for this purpose is described in UK Patent 2020517. The stream of TES symbols is also divided into a number of successive time frames of equal time period and stored such that the time frames stored in respect of the TES symbol stream correspond both in time and duration to the time frames stored in respect of the digital data stream.

The distributions of the TES symbols stored in respect of successive time frames are now determined and compared. As previously mentioned the TES alphabet may consist of 27 TES symbols and hence, each stored TES symbol may be represented by a 5 bit binary word. The identity of each TES symbol stored in respect of successive time frames can, therefore, be determined easily by reading the stored 5 bit binary words. The frequency with which any TES symbol occurs may then be determined by incrementing a counter each time a particular 5 bit binary word is recognized. In this way a table can be formulated which shows, for successive time frames, the distribution of the stored TES symbols. The information contained in the table can be generated and stored in any apparatus suitable for this purpose, such as a computer.

FIG. 2 illustrates the information which could be contained in such a table. FIG. 2 shows clearly the distribution of the TES symbols in any time frame. In time frame 1 for example, which represents the TES symbols generated by time encoding 10 milliseconds of speech, it can be seen that only TES symbols 1 to 5 were derived and that TES symbol 2 occurred most frequently.

The distribution of the TES symbols in successive time frames is now compared. It can be seen from FIG. 2 that there is a little change in the frequency with which the TES symbols occur in time frames 1 to 7 and hence there is a little change in the distribution of the TES symbols in these time frames. This restricted change in distribution indicates that, in the speech waveform from which the TES symbols were derived, there was little change in the character of the speech which occurred in time frames 1 to 7. However, it will be seen that the TES symbol distribution in time frames 8 and 9 differ from the preceding time frames and from each other which indicates a transition from one speech sound to another. Time frame 11 is identical to that of time frame 10 which indicates that the character of the speech was essentially constant for this 20 millisecond period. Although the TES symbols stored in respect of time frames 10 and 11 are identical, the digital data stored in respect of the same time frames of the digital data stream produced for example by Pulse Code Modulation may differ greatly in view of the sampling rate and the binary codes allocated for each sample.

It has been determined by analyzing segmented TES symbol streams derived from speech that the TES symbol distribution may remain substantially constant through several 10 millisecond time periods indicating the occurrence of considerable repetition redundancy and the encoding method of the present invention proposes to reconstruct the digital data stream in dependence upon the results of the comparison between the TES symbols stored in respect of successive time frames of the TES symbol stream to eliminate a proportion of this repetition redundancy.

The digital data stream is reconstructed by recalling the digital data stored in respect of the successive time frames. However, the digital data stored in respect of any particular successive time frame is not recalled until the distribution of the TES symbols stored in respect of that time frame has been compared with the distribution of the TES symbols stored in respect of one or more preceding time frames. The results of this comparison then determine whether the digital data in the particular time frame is recalled to form part of the reconstructed digital data stream or whether the digital data in that time frame is substituted by other digital data, for example a repeat signal to indicate that the repetition of a previous time frame, with a similar TES symbol distribution may be substituted. This repeated digital data may consist of the digital data stored in respect of a preceding time frame if the TES symbol distribution between the two time frames is substantially identical or it may consist of digital data which is derived from the digital data stored in respect of several preceding time frames if the difference in the TES symbol distribution in these preceding time frames is within pre-determined limits.

This procedure may be seen more clearly with reference to FIG. 2.

Referring firstly to time frames 10 and 11, if a comparison is made between the TES symbol distribution in these frames it will be recognized that the distributions for the two time frames are identical. As a result of this comparison the digital data stored in respect of time frame 11 would not be recalled and a repeat signal would be generated indicating that the digital data stored in respect of time frame 10 is to be repeated to replace the data stored in respect of time frame 11.

This repeat signal would replace the data stored in respect of time frame 11 and hence, the bit rate of the encoded digital data stream would be reduced in comparison to the bit rate of the digital data stream derived from digitizing the analogue speech waveform by known methods, such as PCM.

Referring now to time frames 1 to 7 shown in FIG. 2, if a comparison is made between the TES symbol distribution it can be seen there is little change between time frames 1 to 7. However, as there are several time frames having similar TES symbol distribution it may not be possible to repeat any one of these time frames seven times without affecting the character of the speech reconstructed from the encoded data. Hence, the reconstructed or encoded data stream could consist of the repetition of the digital data stored in respect of a selected smaller number of these time frames with a repeat signal generated to indicate when the repetition of a selected time frame is to occur. In this manner the repeated time frames are substituted in the encoded data stream by the repeat signals thereby effecting a reduction in the bit rate of the data stream whilst maintaining the character of any speech reconstructed from the data.

With regard to time frames 7, 8 and 9 in FIG. 2, it can be seen that these frames differ considerably from each other and therefore, a repeat strategy would not be adopted for these frames since the comparison of the TES symbol distribution in these frames would not show sufficient similarity.

With reference to time frames 21 to 30 in FIG. 2 it can be seen that the TES symbol distribution in time frames 21 to 25 is almost identical, there being minor variations in the frequency of TES symbols 7 and 9. As a result, the digital data stored in respect of time frames 21 to 25 would not be recalled and could be substituted in the reconstructed digital data stream by repeat signals indicating when a selected time frame is to be repeated, as previously described in relation to time frames 1 to 7. A similar procedure may be applied to segments 26 to 28 and segments 29 and 30 as the variations in TES symbol distribution in these time frames are also slight. The digital data which is substituted into the reconstructed digital data stream may be derived according to predetermined guidelines which enable the maximum possible reduction in the bit rate whilst maintaining acceptable quality in the reconstructed speech.

Therefore, by adopting the method of the present invention the analogue speech waveform is encoded into a stream of digital data which may comprise sections of digital data derived directly by known methods such as PCM interleaved with frames of digital data derived in dependence upon the results of the comparison made on the TES symbol distribution stored in respect of successive time frames.

The reconstructed digital data stream may be either transmitted or stored for subsequent transmission by known methods.

The method of the present invention is also applicable when the digital data stream comprises a TES digital data stream. In this case the presence of repeat signals may preferably indicate that, for example, selected TES symbols or groups of TES symbols may be omitted throughout the time frames being compared to reduce the transmission bit rate. On reception or reconstruction the remaining TES symbols or groups of TES symbols may be repeated to replace those symbols or groups of symbols selected for omission in order to reconstruct an acceptable version of the original speech waveform.

Furthermore, the present invention has been described with reference to first order probability distribution but it should be understood that higher order probability distribution or alternative probability distribution may equally be used to advantage with the present invention.

What is claimed is:

1. An encoding method for an analogue waveform, the method comprising the steps of deriving a stream of time encoded speech symbols from the analogue waveform, dividing the stream of time encoded speech symbols into successive time frames of equal time period, each time frame corresponding to a plurality of said time encoded speech symbols, storing the time encoded speech symbols for successive time frames, determining and comparing the distribution of the time encoded speech symbols in successive time frames, deriving a digital data stream from said analogue waveform, dividing the digital data stream into a number of successive time frames corresponding to the successive time frames of the time encoded speech symbols, storing the digital data in respect of successive time frames, and deriving an encoded digital signal from said digital data stored in respect of successive time frames with a repeat signal being substituted in place of the stored digital data of one or more time frames dependent upon the results of the comparison of time encoded speech symbols for successive time frames.

2. A method according to claim 1, wherein deriving an encoded digital signal from said digital data stored in respect of successive time frames with a repeat signal being substituted in place of the stored digital data of one or more time frames is dependent upon the results of the comparison of the distribution of the time encoded speech symbols for successive time frames.

3. A method according to claim 2, characterized in that the repeat signal for a particular time frame indicates that the digital data of the time frame immediately preceding the particular time frame is to be repeated.

4. A method according to claim 2, characterized in that the repeat signal indicates that the digital data of one or more time frames is to be repeated.

5. A method according to claim 2 wherein the time frames are of 10 to 20 millisecond time period.

6. A method according to claim 2, characterized in that the encoded digital signal is stored.

7. A method according to claim 2 wherein the reconstructed digital data stream is transmitted.

8. A method according to claim 2, wherein the digital data stream derived from the analogue waveform comprises a stream of time encoded speech symbols and the repeat signal indicates that one or more time frames of time encoded speech symbols in the digital data stream are to be repeated.

9. A method according to claim 2 wherein the digital data stream is derived from the analogue waveform by pulse code modulation.

10. A method according to claim 2 wherein the digital data stream is derived from the analogue waveform by delta modulation.

11. A method according to claim 2 wherein the analogue waveform comprises a speech waveform.

* * * * *